United States Patent
Guo et al.

(10) Patent No.: US 9,281,201 B2
(45) Date of Patent: Mar. 8, 2016

(54) METHOD OF MANUFACTURING SEMICONDUCTOR DEVICE HAVING METAL GATE

(71) Applicant: UNITED MICROELECTRONICS CORP., Hsin-Chu (TW)

(72) Inventors: Ted Ming-Lang Guo, Tainan (TW); Chiu-Hsien Yeh, Tainan (TW); Chin-Cheng Chien, Tainan (TW); Chun-Yuan Wu, Yun-Lin County (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 134 days.

(21) Appl. No.: 14/029,824

(22) Filed: Sep. 18, 2013

(65) Prior Publication Data

US 2015/0079777 A1    Mar. 19, 2015

(51) Int. Cl.
| | |
|---|---|
| *H01L 21/28* | (2006.01) |
| *H01L 21/8238* | (2006.01) |
| *H01L 29/49* | (2006.01) |
| *H01L 29/66* | (2006.01) |
| *H01L 29/78* | (2006.01) |
| *H01L 21/321* | (2006.01) |
| *H01L 21/3213* | (2006.01) |

(52) U.S. Cl.
CPC ........ *H01L 21/28176* (2013.01); *H01L 21/321* (2013.01); *H01L 21/32134* (2013.01); *H01L 21/823842* (2013.01); *H01L 29/4966* (2013.01); *H01L 29/66545* (2013.01); *H01L 29/7833* (2013.01)

(58) Field of Classification Search
CPC .............. H01L 21/28; H01L 21/28114; H01L 21/28176; H01L 21/321; H01L 21/32134
See application file for complete search history.

(56) References Cited

U.S. PATENT DOCUMENTS

| | | | |
|---|---|---|---|
| 5,892,282 | A | 4/1999 | Hong |
| 6,096,659 | A | 8/2000 | Gardner |
| 6,177,303 | B1 | 1/2001 | Schmitz |
| 6,303,418 | B1 | 10/2001 | Cha |
| 6,458,684 | B1 | 10/2002 | Guo |
| 6,573,134 | B2 | 6/2003 | Ma |
| 6,960,416 | B2 | 11/2005 | Mui |
| 7,126,199 | B2 | 10/2006 | Doczy |
| 7,144,783 | B2 | 12/2006 | Datta |

(Continued)

OTHER PUBLICATIONS

Hwang, Title of Invention: Metal Gate and Fabricating Method Thereof, U.S. Appl. No. 13/082,387, filed Apr. 7, 2011.

(Continued)

*Primary Examiner* — Caleb Henry
*Assistant Examiner* — Mounir Amer
(74) *Attorney, Agent, or Firm* — Winston Hsu; Scott Margo

(57) ABSTRACT

A method of manufacturing a semiconductor device having a metal gate is provided. A substrate having a first conductive type transistor and a second conductive type transistor formed thereon is provided. The first conductive type transistor has a first trench and the second conductive type transistor has a second trench. A first work function layer is formed in the first trench. A hardening process is performed for the first work function layer. A softening process is performed for a portion of the first work function layer. A pull back step is performed to remove the portion of the first work function layer. A second work function layer is formed in the second trench. A low resistive metal layer is formed in the first trench and the second trench.

19 Claims, 5 Drawing Sheets

(56) References Cited

U.S. PATENT DOCUMENTS

| | | |
|---|---|---|
| 7,148,548 B2 | 12/2006 | Doczy |
| 7,153,784 B2 | 12/2006 | Brask |
| 7,176,090 B2 | 2/2007 | Brask |
| 7,186,605 B2 | 3/2007 | Cheng |
| 7,208,361 B2 | 4/2007 | Shah |
| 7,217,611 B2 | 5/2007 | Kavalieros |
| 7,355,281 B2 | 4/2008 | Brask |
| 7,407,876 B2 | 8/2008 | Ishizaka |
| 7,556,998 B2 | 7/2009 | Park |
| 7,700,479 B2 | 4/2010 | Huang |
| 2006/0024953 A1 | 2/2006 | Papa Rao |
| 2007/0145591 A1 | 6/2007 | Yano |
| 2007/0259519 A1 | 11/2007 | Yang |
| 2007/0262451 A1 | 11/2007 | Rachmady |
| 2007/0272123 A1 | 11/2007 | Kennedy |
| 2008/0076216 A1 | 3/2008 | Pae |
| 2008/0224235 A1 | 9/2008 | Lavoie |
| 2009/0057769 A1 | 3/2009 | Wei |
| 2009/0186458 A1 | 7/2009 | Yu |
| 2010/0044783 A1 | 2/2010 | Chuang |
| 2010/0065926 A1 | 3/2010 | Yeh |
| 2010/0068877 A1 | 3/2010 | Yeh |
| 2010/0087055 A1 | 4/2010 | Lai |
| 2010/0124818 A1 | 5/2010 | Lee |
| 2010/0244141 A1 | 9/2010 | Beyer |
| 2011/0309449 A1* | 12/2011 | Ando et al. .................. 257/369 |
| 2012/0129331 A1* | 5/2012 | Choi et al. .................. 438/592 |
| 2012/0319205 A1* | 12/2012 | Hempel et al. ............... 257/368 |

OTHER PUBLICATIONS

Fu, Title of Invention: Manufacturing Method for Semiconductor Device Having Metal Gate, U.S. Appl. No. 13/326,342, filed Dec. 15, 2011.

* cited by examiner

METHOD OF MANUFACTURING SEMICONDUCTOR DEVICE HAVING METAL GATE

BACKGROUND OF THE INVENTION

1. Field of the Invention

The present invention relates to a method of manufacturing a semiconductor device having at least a metal gate, and more particularly, to a method of manufacturing a semiconductor device having a metal gate with a U-shape work function layer.

2. Description of the Prior Art

Poly-silicon is conventionally used as a gate electrode in semiconductor devices, such as the metal-oxide-semiconductor (MOS). However, with a trend toward scaling down the size of semiconductor devices, the conventional poly-silicon gate has faced problems such as inferior performance due to boron penetration and unavoidable depletion effect which increases equivalent thickness of the gate dielectric layer, reduces gate capacitance, and worsens a driving force of the devices. Therefore, work function metals are used to replace the conventional poly-silicon gate to be the control electrode that are suitable for use as the high-K gate dielectric layer.

In a complementary metal-oxide semiconductor (CMOS) device, one of the dual work function metal gates is used in an NMOS device and the other one is alternatively used in a PMOS device. It is well-known that compatibility and process control for the dual metal gate are more complicated, meanwhile thickness and composition controls for materials used in the dual metal gate method are more precise. The conventional dual metal gate methods are categorized into gate first processes and gate last processes. In a conventional dual metal gate method applied with the gate first process, the annealing process for forming the source/drain ultra-shallow junction, and the silicide process are performed after forming the metal gate. In the conventional gate last process, a sacrificial gate or a replacement gate is provided and followed by performing processes used to construct a normal MOS transistor. Then, the sacrificial/replacement gate is removed to form a gate trench. Consequently, the gate trench is filled with metals according to the different electrical requirements.

Though the gate last process is able to avoid processes of high thermal budget and to provide more material choices for the high-k gate dielectric layer and the metal gate, the gate last process still faces integrity requirements for the complicated processes and reliability requirement for the layers filling in the gate trench.

SUMMARY OF THE INVENTION

The present invention therefore provides a method of manufacturing a semiconductor device having a metal gate.

The method includes the following steps. A method of manufacturing a semiconductor device having a metal gate is provided. A substrate having a first conductive type transistor and a second conductive type transistor formed thereon is provided. The first conductive type transistor has a first trench and the second conductive type transistor has a second trench. A first work function layer is formed in the first trench. A hardening process is performed for the first work function layer. A softening process is performed for a portion of the first work function layer. A pull back step is performed to remove the portion of the first work function layer. A second work function layer is formed in the second trench. A low resistive metal layer is formed in the first trench and the second trench.

In order to form the featured U-shaped first work function layer with high quality, the $O_2$ ambient treatment is performed to improve its quality. Next, the first work function layer is subjected to a dry etching process, so the upper portion thereof can be removed easily by a wet etching process. Comparing to conventional arts, the U-shaped first work function layer can has high quality and is easy to fabricate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
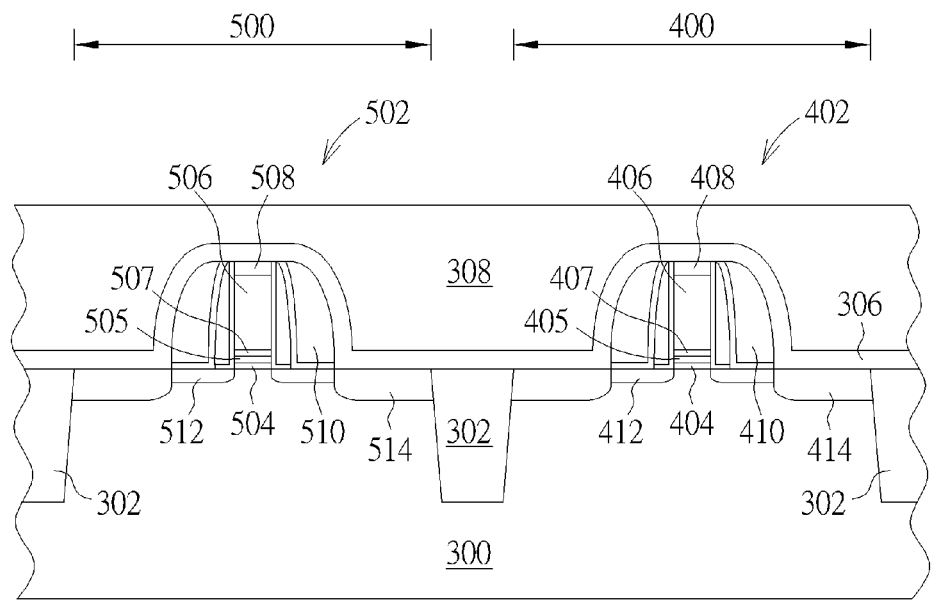
FIG. 1 to FIG. 10 illustrate schematic diagrams of the first embodiment of the method of fabricating a semiconductor device having a metal gate in the present invention.

To provide a better understanding of the presented invention, preferred embodiments will be made in detail. The preferred embodiments of the present invention are illustrated in the accompanying drawings with numbered elements.

Please refer to FIG. 1 to FIG. 9, illustrating schematic diagrams of the first embodiment of the method of fabricating a semiconductor device having at least metal gate in the present invention. First, a substrate 300 is provided, such as a silicon substrate, a silicon-containing substrate or a silicon-on-insulator (SOI) substrate. A plurality of shallow trench isolations (STI) 302 is disposed on the substrate 300. In one embodiment, the STI 302 can provide a stress. According to the areas encompassed by the STI 302, a first active region 400 and a second active region 500 are defined on the substrate 300. Then, a first conductive type transistor 402 and a second conductive type transistor 502 are formed on the substrate 300 respectively in the first active region 400 and the second active region 500. In one preferred embodiment of the present invention, the first conductive type transistor 402 is a P-type transistor, while the second conductive type transistor 502 is an N-type transistor.

As shown in FIG. 1, the first conductive type transistor 402 includes a first interface layer 404, a first gate dielectric layer 405, a first etch stop layer 407, a first sacrificial gate 406, a first capping layer 408, a first spacer 410, a first lightly doped drain (LDD) 412 and a first source/drain 414. In one preferred embodiment of the present invention, the first interface layer 404 is can be a $SiO_2$ layer. In another embodiment, the first interface layer 404 can be omitted. The first gate dielectric layer 405 includes a dielectric material such as $SiO_2$, and in one preferred embodiment, it includes a high-k dielectric material such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), yttrium oxide ($Yb_2O_3$), yttrium silicon oxide (YbSiO), zirconium aluminate (ZrAlO), hafnium aluminate (HfAlO), aluminum nitride (AlN), titanium oxide ($TiO_2$), zirconium oxynitride (ZrON), hafnium oxynitride (HfON), zirconium silicon oxynitride (ZrSiON), hafnium silicon oxynitride (HfSiON), strontium bismuth tantalite ($SrBi_2Ta_2O_9$, SBT), lead zirconate titanate ($PbZr_xTi_{1-x}O_3$, PZT) or barium strontium titanate ($Ba_xSr_{1-x}TiO_3$, BST), but is not limited thereto. The first etch stop layer 407 includes metal/metal nitride, such as TiN. The first sacrificial gate 406 is a poly-silicon gate. In another embodiment, the first sacrificial gate 406 is a multi-layered gate including a poly-silicon layer, an amorphous silicon layer or a germanium layer. In another embodiment, the sacrificial gate 406 may include an inclined sidewall, thereby forming an "up-large-bottom-small" structure. The first capping layer 408 is a SiN layer for example. The first spacer 410 can be a multi-layered structure including high temperature oxide (HTO), SiN, SiO or SiN formed by hexachlorodisilane ($Si_2Cl_6$) (HCD-SiN). In one embodiment, the first spacer 410 can be partially or completely removed to produce a desired stress of the contact etch stop layer (CESL) 306 toward the first conductive type transistor 402 and the second conductive type transistor 502. The first LDD 412 and the first source/drain 414 are formed by appropriate implant doping.

The second conductive type transistor 502 includes a second interface layer 504, a second gate dielectric layer 505, a second etch stop layer 507, a second sacrifice gate 506, a second capping layer 508, a second spacer 510, a second LDD 512 and a second source/drain 514. The embodiment of each component in the second conductive type transistor 502 is similar to that of the first conductive type transistor 402 and is not described repeatedly. In addition, the first conductive type transistor 402 and the second conductive type transistor 502 can further include other semiconductor structures which are not explicitly shown in FIG. 1, such as a silicide layer, a source/drain having an hexagon (also called sigma Σ) or octagon shaped cross-section which is formed by selective epitaxial growth (SEG), or other protective films. After forming the first conductive type transistor 402 and the second conductive type transistor 502, a contact etch stop layer (CESL) 306 and an inter-layer dielectric (ILD) layer 308 are formed on the substrate 300 to cover the first conductive type transistor 402 and the second conductive type transistor 502. In one embodiment, the CESL 306 can generate a stress to form a selective strain scheme (SSS) wherein a compressing force is applied on the first conductive type electrode 402 and a straining force is applied on the second conductive type electrode 502.

Figure 2:
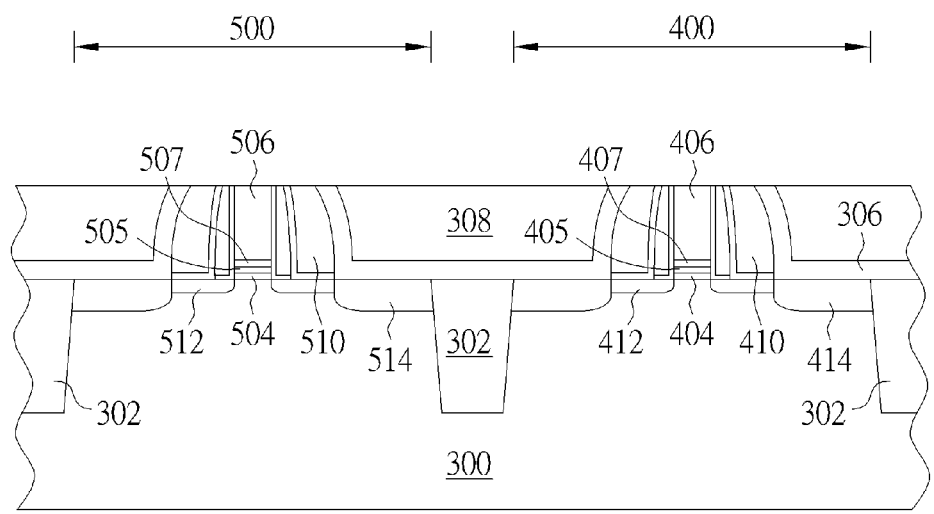

As shown in FIG. 2, a planarization process, such as a chemical mechanical polish (CMP) process or an etching-back process or their combination is performed to remove a part of the ILD layer 308, a part of the CESL 306, a part of the first spacer 410, a part of the second spacer 510, and completely remove the first capping layer 408 and the second capping layer 508, until the top surface of the first sacrificial gate 406 and the second sacrificial gate 506 are exposed.

Figure 3:
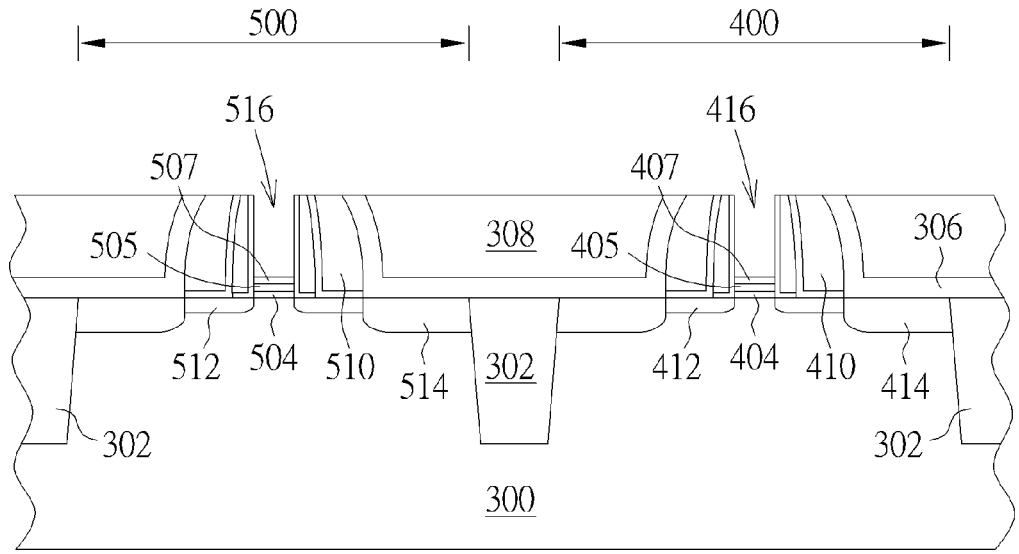

As shown in FIG. 3, a dry etching process and/or a wet etching process is performed to remove the first sacrificial gate 406 and the second sacrificial gate 506 until exposing the first etch stop layer 407 and the second etch stop layer 507. A first trench 416 is formed in the first conductive type transistor 402 and a second trench 516 is formed in the second conductive type transistor 502. In one embodiment, the first etch stop layer 407 and the second etch stop layer 507 are retained, and in another embodiment, they can be removed away.

Figure 4:
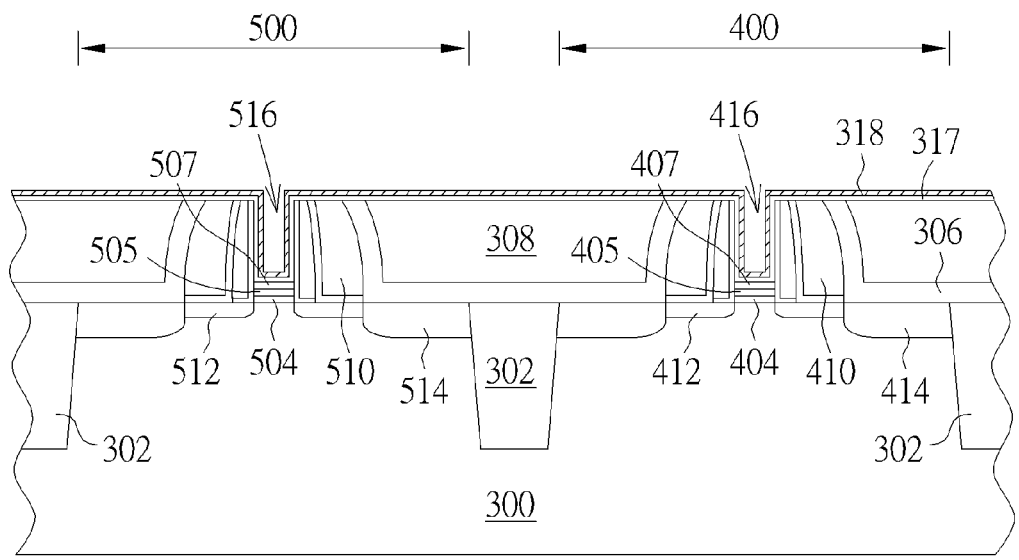

As shown in FIG. 4, a barrier layer 317 is formed on the substrate 300. The barrier layer 317 is formed on the surface of the first trench 416 and the second trench 516 where the first trench 416 and the second trench 516 are not completely filled with the barrier layer 317. The barrier layer 317 includes metal/metal nitride such as TaN. Next, a first work function layer 318 is formed on the barrier layer 317. In the present embodiment, the first work function layer 318 serves as a work function metal required by a first conductive type transistor such as a P-type transistor in which the first work function metal 318 includes Ni, Pd, Pt, Be, Ir, Te, Re, Ru, Rh, W, Mo, WN, RuN, MoN, TiN, TaN, WC, TaC or TiC, but should not be limited thereto. The first work function layer 318 has a good etching selectivity with respect to the barrier layer 317.

Figure 5:
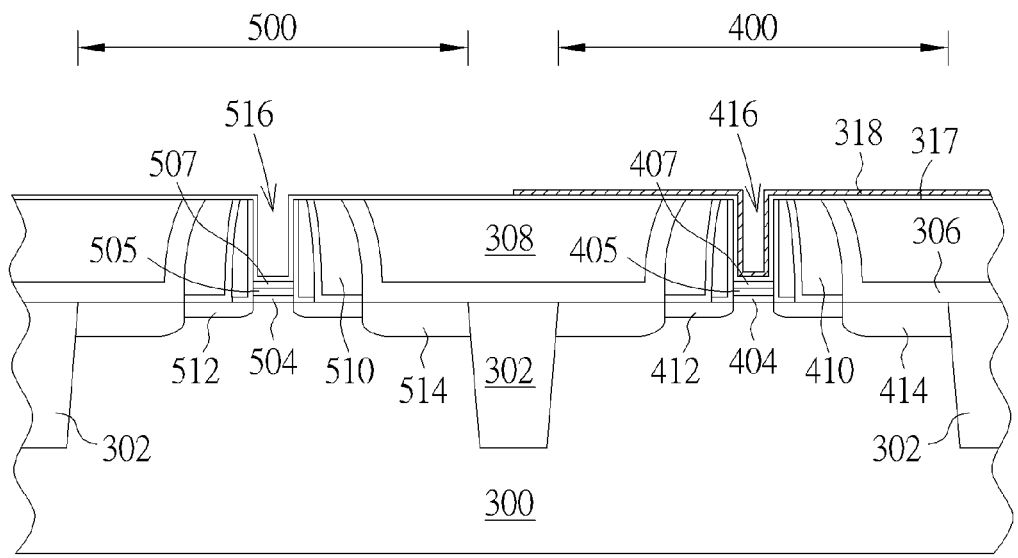

As shown in FIG. 5, the first work function layer 318 is patterned to remove at least the portion thereof in the second active region 500. Since there is an etching selectivity between the first work function metal 318 and the barrier layer 317, the barrier layer 317 in the second active region 500 is not removed. Next, an $O_2$ ambience treatment is performed on the first work function layer 318. The $O_2$ ambience treatment may include an annealing process, a plasma treatment process or a chemical treatment process. In one preferred embodiment, the annealing process includes supplying gas containing $O_2$ under 300° C. to 500° C., preferably 100% $O_2$ gas under 400° C. for 1-5 minutes, preferably 2 minutes. The plasma treatment process includes using plasma containing $O_2$. The chemical treatment includes using a chemical solvent containing $NH_4OH$, $H_2O_2$ and $H_2O$, such as SC1 solvent. After the $O_2$ ambience treatment, the first work function layer 318 is "hardened" and the quality thereof is improved. In another embodiment, the $O_2$ ambience treatment can be performed before patterning the first work function layer 318, for example, it can be performed after forming the first work function layer 318 and before patterning the first work function layer 318.

Figure 6:
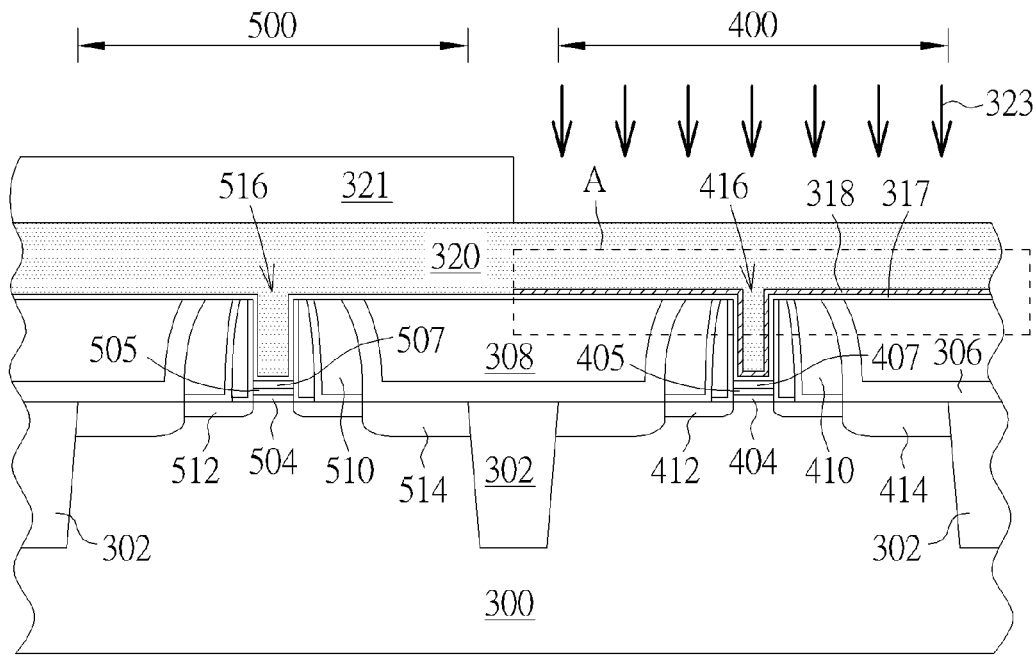

As shown in FIG. 6, a sacrifice layer such as an organic layer 320 is formed on the first work function layer 318. Preferably, the first trench 416 and the second trench 516 are completely filled with the organic layer 320. The organic layer 320 may be made of any organic material that has good gap filling ability, such as light absorbing oxide (DUO), spin-on-glass (SOG), bottom anti-reflective coating (BARC layer), or sacrificial light absorbing material (SLAM). Subsequently, a dry etching process 323 is performed. Preferably, the dry etching process is performed when the second active region 500 is masked, for example, when the second active region 500 is covered by a patterned photoresist layer 321, which covers the second active region 500 but exposes the first active region 400. In the present disclosure, the dry etching process 323 is used to "softening" a portion of the first work function layer 318 so as to make it easy to be removed in the subsequently steps. In one preferred embodiment, because during the dry etching process 323, the first work function layer 318 is still covered by the organic layer 320, only the upper portion of the first work function layer 318 (region A in FIG. 6) is "softened", and the bottom portion of the first work function layer 318 (disposed at the bottom of the first trench 416) is not softened (and still is "hardened"). In one embodiment, the dry etching process 323 contains using a fluoride-containing gas. In detail, the dry etching process 323 is performed under a condition as follows: $CF_4$ between 5 and 15 sccm, $H_2$ between 80 and 120 sccm, $N_2$ between 350 and 450 sccm, and a pressure between 12 and 18 mtorr, for example. It is noted that the thickness of the organic layer 320 is one factor that may affects the "softening" of the first work function layer 318 and thus it should be of a sufficient value. In one embodiment, before the dry etching process, the thickness of the organic layer 320 is substantially between 100 angstroms and 250 angstroms.

Figure 7:
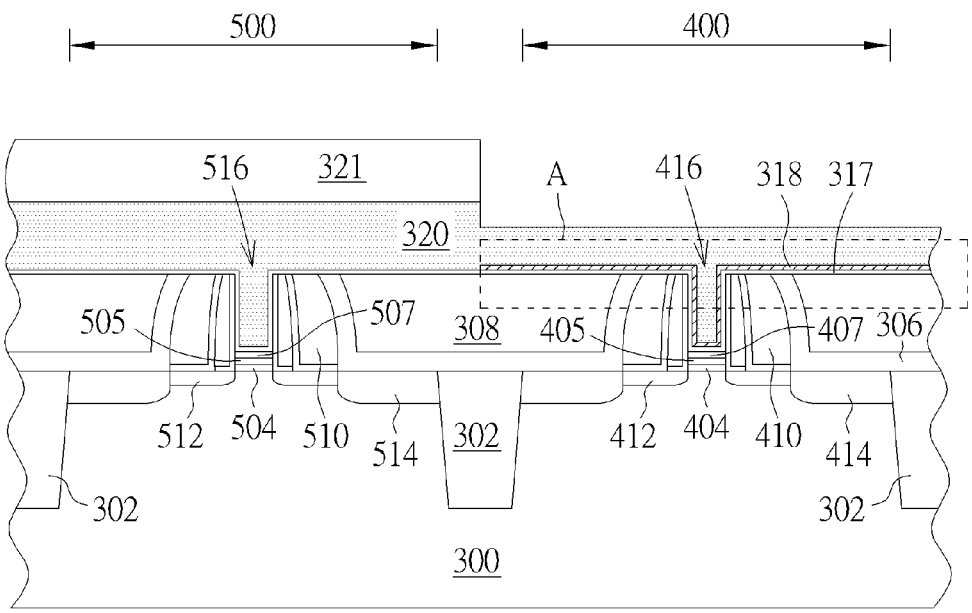

As shown in FIG. 7, after the dry etching process 323, some portion of the organic layer 320 is consumed so the thickness of the organic layer 320 is reduced. However, the first trench 416 is still completely filled with the organic layer 320 and there is still organic layer 320 disposed outside the first trench 416 and above the first work function layer 318. At this time, the first work function layer 318 is not exposed. In another embodiment, after the dry etching process 323, nearly no organic layer 320 is consumed so the thickness of the organic layer 320 remains the same.

Figure 8:
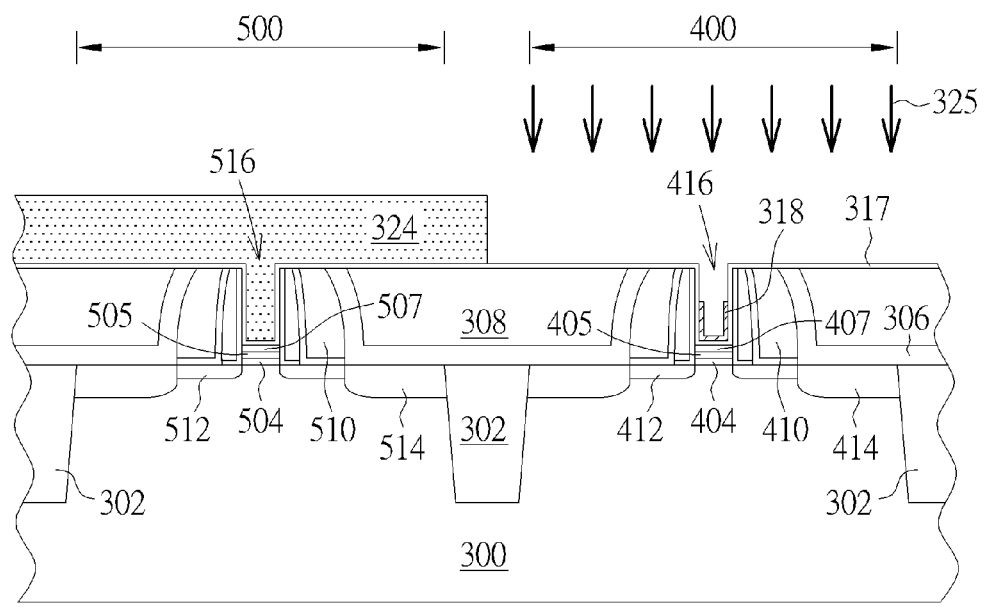

As shown in FIG. 8, an etching process is performed to respectively remove the patterned photoresist layer 321 and the organic layer 320 so as to expose the first work function layer 318. Another patterned photoresist layer 324 is formed on the substrate 300 to cover the second active region 500 and expose the first active region 400. Next, a pull back step 325, preferably a wet etching process, is carried out to remove the "softened" portion of the first work function layer 318. As shown in FIG. 8, after the wet etching process 325, the portion of the first work function layer 318 outside the first trench 416 and near the opening of the first trench 416 (that is, the region A in FIG. 6) is removed, and the rest of the first work function layer 318 (which is still "hardened" portion) that resides at the bottom of the first trench 416 is remained, thereby forming a U-shaped structure in which the topmost portion of the U-shaped structure is lower than the opening of the first trench 416. Therefore, the opening of the first trench 416 is enlarged. It is noted that by using the wet etching process 325 instead of the dry etching process, the "softening" portion of the first work function layer 318 can be removed more easily. In one embodiment, the wet etching process 325 comprises using HF/SC1 or HF/SC2. In one embodiment, the SC1 solution is 1:1:5 mixture of $NH_4OH$, $H_2O_2$, $H_2O$, and the SC2 solution is 1:1:6 mixture of HCl, $H_2O_2$, $H_2O$, for example.

Figure 9:
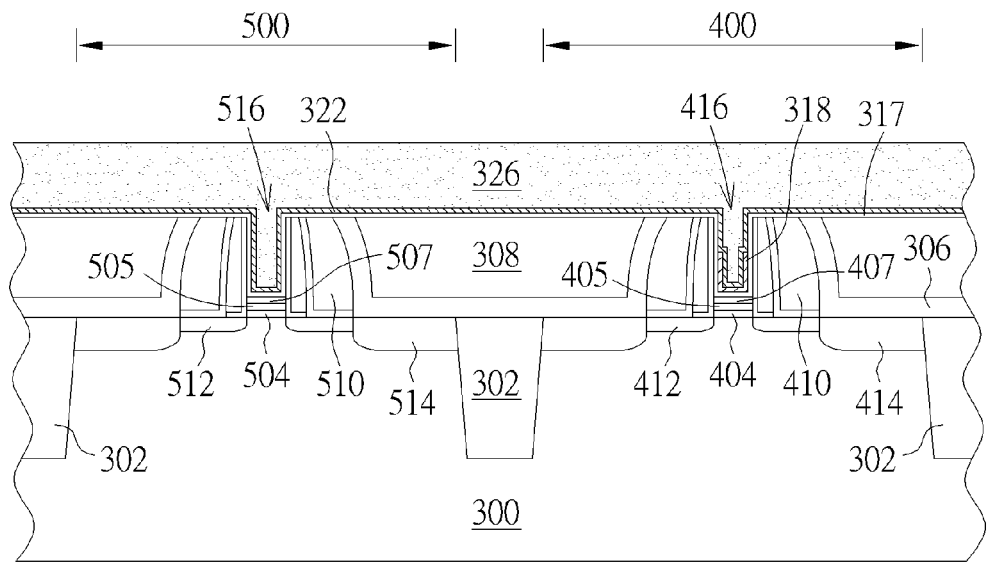

As shown in FIG. 9, a second work function layer 322 is formed on the substrate 300. The second work function layer 322 is formed conformally on the surface of barrier layer 317 in the second trench 516 and on the surface of the barrier layer 317 and the first work function layer 318 in the first trench 416. Since the opening of the first trench 416 is enlarged, the gap filling profile of the second work function layer 322 is improved so the void defect can be avoided. In one embodiment, the second metal layer 324 serves as a work function metal required by a second conductive type transistor such as an N-type transistor in which the second work function layer 322 includes titanium aluminides (TiAl), aluminum zirconium (ZrAl), aluminum tungsten (WAl), aluminum tantalum (TaAl) or aluminum hafnium (HfAl), but should not be limited thereto. Next, a low resistive metal layer 326 is formed on the substrate 300. The metal layer 326 is formed on the second work function layer 322 and completely fills the first trench 416 and the second trench 516. The metal layer 326 includes Al, Ti, Ta, W, Nb, Mo, TiN, TiC, TaN, Ti/W or Ti/TiN, but is not limited thereto.

Figure 10:
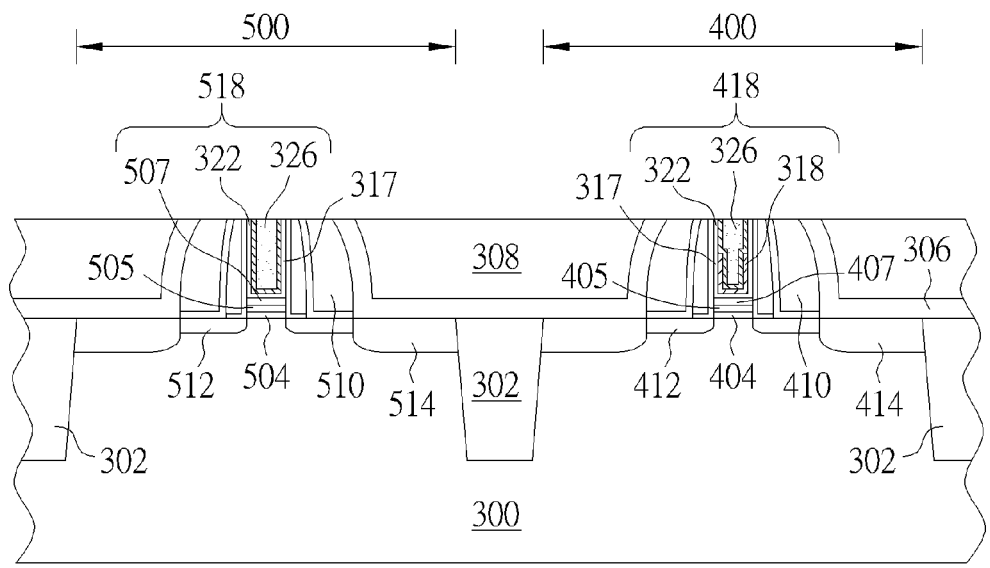

As shown in FIG. 10, a planarization process is performed to simultaneously remove the first work function layer 318, the second work function layer 322, the barrier layer 317 and the low resistive metal layer 326 outside the first trench 416 and the second trench 516. Thus, the low resistive metal layer 326, the second work function layer 322, the first work function layer 318, the barrier layer 317, the first etch stop layer 407 (if not removed) together form a first metal gate 418 of the first conductive type transistor 402 (P-type transistor), which has a work function substantially between 4.8 eV and 5.2 eV. The low resist layer metal layer 326, the second work function layer 322, the barrier layer 317, the second etch stop layer 507 (if not removed) together form a second metal gate 518 of the second conductive type transistor 502 (N-type transistor) which has a work function substantially between 3.9 eV and 4.3 eV. Because the $O_2$ ambience treatment is performed to the first work function layer 318, and/or the barrier layer 317, the first metal gate 418 and the second metal gate 518 can have a better work function.

In the present invention, it is one salient characteristic that in order to form the featured U-shaped first work function layer 318 with high quality, the $O_2$ ambient treatment is performed to improve its quality (namely "hardening process") (FIG. 5). Next, the first work function layer 318 is subjected to a dry etching process 323 (namely "softening process") (FIG. 6), so the upper portion thereof can be removed easily by a wet etching process 325 (FIG. 8). Comparing to conventional arts, the U-shaped first work function layer 318 can has high quality and is easy to fabricate.

It is understood that the present treatment can also be applied to the second work function layer 322. In other words, a U-shaped first work function layer 318 and/or a U-shaped second work function layer 322 can be formed by using the method in the present invention. It is still understood that the present invention can be used any method for forming a semiconductor device with a metal gate and is not limited to the aforementioned embodiment. For example, in another embodiment, the first sacrificial gate 406 and second sacrificial gate 506 can be removed separately, and the step for forming the U-shaped first work function 318 can be performed between the step of removing the first sacrificial gate 406 and the step of removing the second sacrificial gate 506.

It should be noted that the above methods present forming the high-k gate dielectric layer at first (namely, the high-K first process). However, those skilled in the art can realize that, in the present invention, it is also available to form the gate dielectric layer after removing the sacrificial gate (namely, the high-k last process). For example, a high-k layer can be formed on the surface of the first trench 416 before forming barrier layer 317. Subsequently, the first work function layer 318, the second work function layer 322 and the metal layer 326 are formed on the high-k gate dielectric layer in the first trench 416 and the second trench 516. In this embodiment, the high-K gate dielectric layer will form a U shape in their cross section. When the invention is performed in the high-k last process, the material of the dielectric layer formed under the sacrifice gate is not limited to high-k material but can include another dielectric material such as $SiO_2$.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a semiconductor device having a metal gate, comprising:
    providing a substrate having a first conductive type transistor and a second conductive type transistor formed thereon, the first conductive type transistor having a first trench and the second conductive type transistor having a second trench;
    forming a first work function layer on the first trench and the second trench;
    patterning the first work function layer to remove the first work function layer on the second trench;
    after patterning the first work function layer, performing a hardening process for the patterned first work function layer;
    performing a softening process for a portion of the first work function layer with a patterned photoresist layer disposed on the second trench but not on the first trench;
    performing a pull back step to remove the portion of the first work function layer;
    after the pull back step, forming a second work function layer in the second trench; and forming a low resistive metal layer in the first trench and the second trench.

2. The method of manufacturing a semiconductor device having a metal gate according to claim 1, wherein the hardening process comprises an $O_2$ ambience treatment.

3. The method of manufacturing a semiconductor device having a metal gate according to claim 2, wherein the $O_2$ ambience treatment comprises an annealing process, a plasma treatment process or a chemical treatment process.

4. The method of fabricating a semiconductor device having a metal gate according to claim 3, wherein the plasma treatment process comprises using a plasma gas comprising oxygen.

5. The method of fabricating a semiconductor device having a metal gate according to claim 3, wherein the chemical treatment process comprises using a solvent comprising $NH_4OH$, $H_2O_2$ and $H_2O$.

6. The method of fabricating a semiconductor device having a metal gate according to claim 1, wherein the softening process comprises a dry etching process.

7. The method of manufacturing a semiconductor device having a metal gate according to claim 6, before performing the dry etching process, further comprising forming a sacrifice layer on the first work function layer.

8. The method of manufacturing a semiconductor device having a metal gate according to claim 7, wherein when performing the dry etching process, the sacrifice layer is disposed directly on the first work function layer.

9. The method of manufacturing a semiconductor device having a metal gate according to claim 7, wherein the sacrifice layer comprises an organic material.

10. The method of manufacturing a semiconductor device having a metal gate according to claim 9, wherein the organic material comprises light absorbing oxide (DUO), spin-on-glass (SOG), bottom anti-reflective coating (BARC layer), or sacrificial light absorbing material (SLAM).

11. The method of manufacturing a semiconductor device having a metal gate according to claim 7, wherein before the dry etching process, a thickness of the sacrifice layer is between 100 angstroms and 250 angstroms.

12. The method of manufacturing a semiconductor device having a metal gate according to claim 6, wherein the dry etching process comprises using a fluoride-containing gas.

13. The method of manufacturing a semiconductor device having a metal gate according to claim 12, wherein the dry etching process is performed under a condition as follows: $CF_4$ between 5 and 15 sccm, $H_2$ between 80 and 120 sccm, $N_2$ between 350 and 450 sccm, and a pressure between 12 and 18 mtorr.

14. The method of manufacturing a semiconductor device having a metal gate according to claim 1, wherein the pull back step comprises a wet etching process.

15. The method of manufacturing a semiconductor device having a metal gate according to claim 14, wherein the wet etching process comprises using $HF/SC_1$ or $HF/SC_2$.

16. The method of manufacturing a semiconductor device having a metal gate according to claim 1, wherein before forming the first work function layer, further comprises forming a barrier layer on a surface of the first trench and the second trench.

17. The method of manufacturing a semiconductor device having a metal gate according to claim 1, wherein after the pull back step, the portion of the first work function near an opening of the first trench is removed.

18. The method of manufacturing a semiconductor device having a metal gate according to claim 17, wherein after the pull back step, an U-shaped first work function layer is formed wherein a topmost portion of the U-shaped first work function layer is lower than the opening of the first trench.

19. The method of manufacturing a semiconductor device having a metal gate according to claim 1, wherein the first work function layer is a P type work function metal layer and the second work function layer is an N type work function metal layer.

* * * * *